United States Patent [19]

Russo

[11] Patent Number: 4,968,943

[45] Date of Patent: Nov. 6, 1990

[54] OPEN BATTERY BANK DETECTOR CIRCUIT

[76] Inventor: Frank J. Russo, 1247 Fairlake Trace, Apt. 1105, Ft. Lauderdale, Fla. 33326

[21] Appl. No.: 345,126

[22] Filed: Apr. 28, 1989

Related U.S. Application Data

[63] Continuation-in-part of Ser. No. 189,389, May 2, 1988, abandoned.

[51] Int. Cl.⁵ ............................................. G01R 31/02
[52] U.S. Cl. .................................... 324/537; 324/434; 324/117 H
[58] Field of Search ............... 324/537, 529, 543, 527, 324/528, 548, 117 H, 251, 434, 427, 117 R

[56] References Cited

U.S. PATENT DOCUMENTS

| | | | |
|---|---|---|---|
| 3,890,370 | 6/1971 | Fleischer | 324/537 |
| 4,198,597 | 4/1980 | Sawyer | 324/434 |
| 4,296,410 | 10/1981 | Higgs et al. | 324/251 X |
| 4,401,942 | 8/1983 | Renz | 324/60 C |
| 4,419,621 | 12/1983 | Becker et al. | 324/548 |
| 4,517,511 | 5/1985 | Suto | 324/529 |
| 4,540,935 | 9/1985 | Burkum et al. | 324/548 |

FOREIGN PATENT DOCUMENTS 56-22976   3/1981   Japan .

Primary Examiner—Reinhard J. Eisenzopf
Assistant Examiner—Robert W. Mueller
Attorney, Agent, or Firm—Eckert, Seamans, Cherin & Mellott

[57] ABSTRACT

The non-intrusive open battery bank detector circuit senses an alternating current component of the DC trickle charge carried by one of a pair of cables connected between the battery charger and the bank of batteries. The detector circuit includes a sensor that is disposed adjacent, but not physically around or electrically connected to, one of the cables. The sensor detects magnetic fields established around the cable. The output of the sensor is connected to a low-pass filter which passes signals consisting primarily of 60 and 120 hertz components. A pre-amplifier amplifies the passed signals. A ripple filter smoothes the pre-amplified signals and a comparator determines whether the smoothed signal is greater than a reference signal thereby signifying the presence of a DC trickle charge on the cable next to the sensor. A transistor switch has its control input connected to the output of the comparator and is triggered on when the output of the comparator is high. The output of the transistor switch is connected to a control coil of a relay switch such that when the transistor is turned on, current passes through the relay coil and closes a normally open contact in the relay. When that relay contact opens, i.e., when the transistor goes off, an alarm circuit is activated.

7 Claims, 1 Drawing Sheet

U.S. Patent  Nov. 6, 1990  4,968,943
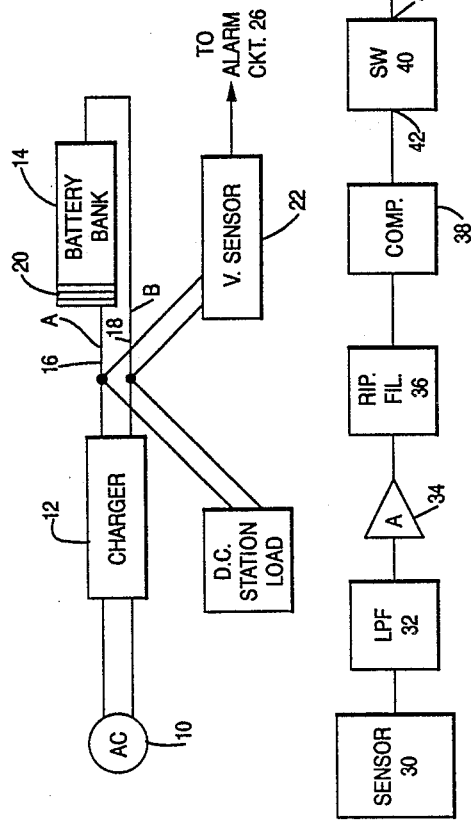
FIG. 1 PRIOR ART
FIG. 2
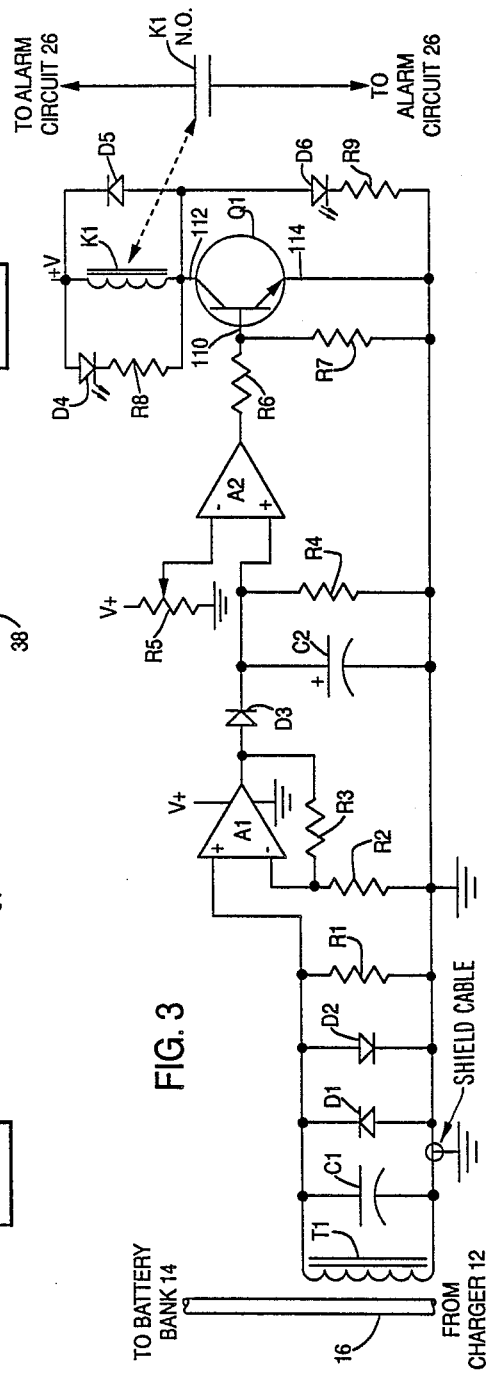
FIG. 3

OPEN BATTERY BANK DETECTOR CIRCUIT

This is a continuation-in-part of U.S. patent application Ser. No. 189,389, filed May 2, 1988, that is now abandoned.

BACKGROUND OF THE INVENTION

Alternating current or AC power systems established and operated by electric utilities and by many large industrial installations must be protected against electrical faults through the use of protective relay schemes located in appropriate power substations. These protective relay schemes clear power system faults by tripping circuit breakers and other devices to interrupt fault currents fed by the AC power system into the fault. The primary source of energy for operation of interrupting devices is a substation direct current or DC system, which normally consists of a bank of stationary batteries, connected in series to give an overall bank voltage typically in the range of 125 to 140 VDC, and a battery charger, which continuously charges the battery bank and which supplies DC current to normal station DC loads. So long as AC station service voltage is supplied to the charger input, the charger will supply nearly all of the DC current required for tripping the interrupting devices. However, if the fault results in a loss of the AC feed to the charger input, then the battery bank must supply all of the DC current required for tripping. If an interconnection between any two battery cells of the bank has opened (as a result of corrosion of interconnection hardware, for example), then the battery bank will not be able to supply the DC current necessary for operation of tripping devices to clear a fault. This is an open battery bank condition and it can result in catastrophic consequences for AC power system equipment.

Present alarm schemes to detect abnormal conditions of the DC system typically include a means of detecting whether the voltage of the DC system is either lower than a specified low limit, typically about 120 VDC, or higher than a specified high limit, typically about 145 VDC. This detection function is commonly achieved through the use of a voltage sensor(s) and over- and under- voltage relays (and associated electronic circuits) connected in parallel with the charger's DC output circuit. However, should the battery bank open with the charger continuing to operate, there would be no indication of this condition, since the DC system voltage would be maintained at normal levels by the charger. The over- and under- voltage relays would not sense that the battery bank had opened. There would be no charging current present in the interconnecting cables of an open bank, but voltage relays cannot detect this condition.

OBJECTS OF THE INVENTION

It is an object of the present invention to provide a non-intrusive, open battery bank detector circuit.

It is another object of the present invention to provide a detector circuit that does not require the sensor in the detector circuit to surround the cable extending between the charger and the bank of batteries or to require a direct electrical connection between that cable and the detector circuit.

It is another object of the present invention to provide an open battery bank detector circuit that is simple in operation and can be manufactured at a low cost.

It is a further object of the present invention to provide an open battery bank detector circuit that is used in conjunction with the prior art over- and under- voltage relays and the associated alarm circuit to indicate that the battery bank has an open connection.

BRIEF DESCRIPTION OF THE DRAWINGS

Further objects and advantages of the present invention can be found in the detailed description of the preferred embodiment when taken in conjunction with the accompanying drawings in which:

FIG. 1 is a block diagram of the prior art alarm system;

FIG. 2 is a block diagram of the open battery bank detector circuit constructed in accordance with the principles of the zpresent invention; and FIG. 3 is a circuit diagram of an embodiment of the open battery bank detector circuit.

SUMMARY OF THE INVENTION

The non-intrusive open battery bank detector circuit senses an alternating current component of the DC trickle charge carried by one of a pair of cables connected between the battery charger and the bank of batteries. The trickle charge current is typically in the range of 500 milliamps to 1 ampere. The detector circuit includes a sensor that is disposed adjacent, but not physically around or electrically connected to, one of the cables. The sensor detects magnetic fields established around the cable. The output of the sensor is connected to a low-pass filter which passes signals consisting primarily of 60 and 120 hertz components. A pre-amplifier amplifies the passed signals. A ripple filter smoothes the pre-amplified signals and a comparator determines whether the smoothed signal is greater than a reference signal thereby signifying the presence of a DC trickle charge on the cable next to the sensor. A transistor switch has its control input connected to the output of the comparator and is triggered on when the output of the comparator is high. The output of the transistor switch is connected to a control coil of a relay switch such that when the transistor is turned on, current passes through the relay coil and closes a normally open contact in the relay. When that relay contact opens, i.e., when the transistor goes off, an alarm circuit is activated.

DETAILED DESCRIPTION OF THE PREFERRED EMBODIMENT

FIG. 1 is a block diagram of the prior art over- and under-voltage sensing circuit currently used to detect problems in the DC substation. Alternating current from generator or AC source 10 (typically 115 VAC) is supplied to a charger 12. Charger 12 is nominally rated to supply a DC output of about 125 volts to battery bank 14 via cables 16 and 18. Battery bank 14 is normally configured as a series of batteries or battery cells, one of which is cell 20, in series. Each cell is typically rated at 2.2 volts. The battery banks are constructed to nominally produce about 133 volts DC when called upon to trip, via protective relay action, circuit breakers and other devices which interrupt fault currents on the utility system. A voltage sensing circuit 22 is electrically connected in parallel with battery bank 14, that is, electrically connected to cables 16 and 18. Voltage sensor 22 senses a high voltage and sends a signal to alarm circuit 26 when the voltage across cables 16 and 18 rises above a specified high limit, typically about 145 volts. Voltage sensor 22 also senses a low voltage and activates the alarm circuit when the voltage across cables 16 and 18 falls below a specified low limit, typically about 120 volts. This may occur when charger 12 fails to charge the battery bank, either through degradation of input voltage, internal circuit failure, or isolation of the output voltage from the battery bank, as by an open protective fuse or circuit breaker in the output circuit. In each case, the DC system voltage will gradually decay as the bank discharges in supplying energy to the normal station DC load. Hence, the battery bank is a long-term storage DC battery bank made of a series of typically 2.2 volt battery cells.

However, if there is a break in cable 16 or 18 down line of voltage sensor 22, that is, at points A or B, charger 12, in normal operation, would still maintain the voltage level on cables 16 and 18 and voltage sensor 22 would not detect the open circuit condition in the battery bank. Particularly, this may occur if an interconnection between battery cell 20 and the other cells is opened or if the connection between one or both of cables 16 and 18 to battery bank 14 has corroded and presents an open circuit condition.

The present invention relates to a non-intrusive, open battery bank detector circuit. FIG. 2 is a block diagram of the circuit. The circuit includes sensor 30 that is disposed adjacent, but not physically around or electrically connected to, one of the cables extending between charger 12 and battery bank 14. The output of the sensor is connected to low-pass filter 32. The low-pass filter passes signals consisting primarily of 60 and 120 hertz components. Sensor 30 senses the magnetic field generated by the AC component of the DC trickle charge flowing between charger 12 and battery bank 14. The AC component of the trickle charge exhibits a sawtooth waveform at a frequency of 120 hertz. The AC component causes an alternating magnetic field to be established about the cable, and this field is sensed by sensor 30. Reliable operation of the detector circuit requires that the AC component have a peak-to-peak amplitude of at least 0.4 volts. The sensor is rated to produce a voltage in the range of tens of millivolts and is rated for 115 VAC, 60 hertz continuous operation, to ensure that several thousand turns of wire will be available for inductive coupling of the alternating magnetic field to the sensor. Low-pass filter 32 passes the AC component sensed by sensor 30 and also acts as a voltage limiter. The output of low-pass filter 32 is fed to pre-amplifier 34. The output of the amplifier is smoothed by ripple filter 36. The output of the ripple filter is applied to a comparator 38. The comparator determines whether the smoothed amplified signal exceeds a minimum reference voltage. The output of comparator 38 is applied to an electronic switch 40. Electronic switch 40 has a control input 42 and a controlled output 44. Electronic switch 40 is activated when the comparator output is high. Switch 40 is set to trigger controlled output 44. When the comparator goes high, controlled output 44 triggers alarm circuit relay 48 to pick up. When the comparator goes low, controlled output 44 triggers alarm circuit relay 48 to drop out. When alarm circuit relay 48 drops out, alarm circuit 26 is activated thereby indicating that the AC component is no longer present on the cable adjacent sensor 30. When this occurs, it is an indication that charger 12 is no longer charging battery bank 14 because of an open battery bank condition.

FIG. 3 is a circuit diagram of a preferred embodiment of the present invention. The sensor is a small coil T1 that is a many turn, iron-core coil rated for 115 VAC, 60 hertz continuous operation. It is estimated that the coil has about 10,000 turns on its primary. The low-pass filter consists of capacitor C1 and resistor R1. The low-pass filter passes the millivolt signal induced in the sensor by the AC component of the DC trickle-charge current; this induced signal includes 60 and 120 hertz components. Diodes D1 and D2 provide a clamping circuit which limits the peak voltage to about 0.7 volts. Coil T1 produces voltage in the range of tens of millivolts. The pre-amplifier consists of amplifier A1 and resistors R2 and R3. The pre-amplification circuit is wired in a non-inverting amplifier configuration. Amplifier A1 is an operational amplifier that amplifies the signal about 100 times. Diode D3 rectifies the pre-amplified signal. The ripple filter consists of capacitor C2 and resistor R4. The ripple filter smoothes the output of amplifier A1 and applies that smoothed output to main stage amplifier A2. Amplifier A2 is configured as a comparator that has a reference voltage set by variable resistor R5.

Resistors R6 and R7 are part of the biasing circuit for the electronic switch. The electronic switch is an NPN transistor Q1. The control input to transistor Q1 is coupled to line 110. The controlled output of the transistor is a combination of lines 112 and 114. Diode D4 is a light emitting diode and resistor R8 is associated with it to limit the current through diode D4. A relay control coil K1 is connected in parallel with diode D4 and resistor R8. Diode D5 is also parallel to relay coil K1 as well as the combination of light emitting diode D4 and resistor R8. Connected in parallel across the collector and emitter of transistor Q1 is light emitting diode D7 and resistor R9.

Relay coil K1 is associated with normally open (N.O.) relay contact K1 which is in the alarm circuit 26. The specifications for each of these components are as follows:

| PARTS LIST | |
|---|---|
| C1 | $0.01 \times 10^{-6}$f |
| D1,D2 | Diode 0.7 v breakdown 1N4148 |
| R1 | 100K ohm |
| R2 | 1K ohm |
| C2 | $470 \times 10^{-6}$f, 35vdc |
| R4 | 33K ohm |
| R5 | 20K ohm variable 15-turn |
| R6 | 100K ohm |
| R7 | 1M ohm |
| D4 | LED (green) size T-1¾" |
| R8 | 4.7K ohm |
| Q1 | NPN |
| D6 | LED (red) size T-1¾" blinking |
| R9 | 4.7k ohm |
| A1,A2 | LM324N |
| D3,D5 | 1N4003 |
| K1 Coil | 12 vdc (1000 ohm minimum) |
| K1 Contacts | 115 VAC, 1 amp. |

Battery charger 12 for stationary battery bank 14 produces a highly regulated DC output voltage. The rectification process in the charger introduces an AC component, known as ripple, into the DC output voltage and current of the charger. Although reduced to a very low level, the AC ripple that is present does produce an alternating magnetic field around the battery interconnection cables. This field, although of very small magnitude, induces a small voltage (typically tens of millivolts) across a small, many-turn, iron-core coil, T1, which is taped or clipped to the insulation of one of the battery bank's interconnecting cables. Accordingly, the coil is physically and electrically non-intrusive with respect to the DC system of the substation. The coil is oriented so that its longitudinal axis is at right angles to the direction of the current passing through the cable. The coil is typically rated for continuous operation at 115 VAC, 60 hertz. In the current embodiment, T1 is a 115 VAC to 12 VAC transformer, with primary and secondary windings connected to form one coil. The leads of coil T1 are connected to the input of the electronic portion of the detector circuit via a pair of No. 24 gauge wires in a shielded cable. The shield of the cable is connected to the reference point (common) of the detector circuit.

Capacitor C1 and resistor R1 of the low-pass filter serve to reduce the effect of extraneous frequencies (resulting from environmental electrical noise) upon the input of the detector and improve its stability. Diodes D1 and D2 limit the voltage applied to the input of operational amplifier A1.

Operational amplifier A1 is connected as a non-inverting amplifier with a gain of 100. When a charging current's ripple field induces a voltage across T1, this induced voltage is amplified by A1 to an AC signal which is rectified by diode D3. The rectified DC voltage present at the cathode of D3 is then fed into the non-inverting input of operational amplifier A2.

Amplifier A2 is connected as a voltage comparator. The reference voltage at the inverting input is established by potentiometer R5, which is adjusted so that when a DC voltage is present at the cathode of D3 (indicating presence of charging current), capacitor C2 is charged, the voltage at the non-inverting input of A2 is more positive than the reference voltage at the inverting input, and the comparator output is high.

When an open battery bank condition exists (as indicated by an absence of charging current), the voltage at the output of amplifier A1 is low, but the comparator does not change state until capacitor C2 has discharged sufficiently (via R4) to reduce the voltage at the non-inverting input of amplifier A2 below the reference voltage. A time delay is thus achieved between loss of charging current and comparator state change. The time delay may be varied by adjustment of R5; five seconds was the value used in a test prototype.

When the battery bank is charging normally, the high output of comparator amplifier A2 is coupled via R6 to the base of transistor Q1, causing it to be biased on. When transistor Q1 is on, its collector current allows the green LED D4 to illuminate and the coil of relay K1 to conduct sufficient current to cause its normally open contacts to close. The closing of contacts K1 resets the external alarm circuit 26. Diode D5 is for protection of the circuit against any high reverse voltages that might result from de-energizing of the relay K1 coil. Red LED D6 is effectively shunted out by the low collector-to-emitter voltage of transistor Q1 and it remains extinguished as long as Q1 is on.

When the battery bank is open, the AC component of the DC trickle charge is no longer present on cable 16, and the low output of comparator amplifier A2 causes transistor Q1 to turn off. The collector current of transistor Q1 is now too small for the coil of K1 to keep the K1 N.O. contacts closed. When the contacts open, the external alarm 26 is initiated. As the collector-to-emitter voltage of Q1 goes high, blinking red LED D6 illuminates to indicate an open battery bank condition, and green LED D4 goes out.

Power for the detector circuit may be supplied from a standard 115 VAC source, by means of a 9 or 12 VDC converter, or from the DC system, by means of a suitable resistor voltage divider. If power to the detector circuit is lost, either through loss of an AC source or through opening of a fuse in the DC power source, both LEDs will be extinguished and the contacts of relay K1 will open and thereby initiate the external alarm.

The sensor 30 may be a Hall effect device of sufficient sensitivity to detect the magnetic field created near the battery interconnection cables by the trickle charge current and capable of supplying, with proper amplification, the necessary input to change the state of comparator amplifier A2.

What is claimed is:

1. A non-intrusive open battery bank detector circuit for sensing an alternating current (AC) component of a substantially direct current (DC) trickle charge carried by one cable of a pair of cables coupling a battery charger and a bank of long term storage batteries, the detector circuit comprising:
   a sensor disposed adjacent, but not physically surrounding or electrically connected to, said one cable, said sensor capable of detecting a magnetic field established around said one cable by said AC component of the DC trickle charge, said DC trickle charge necessary to charge said long term storage batteries;
   a low-pass filter coupled to said sensor, for passing signals consisting primarily of 60 and 120 hertz components;
   a pre-amplifier coupled to an output of said low-pass filter for amplifying the passed signals;
   a ripple filter coupled to an output of said pre-amplifier for smoothing the amplified signals;
   a comparator coupled to an output of said ripple filter for comparing the smoothed signals to a predetermined reference signal and generating a control signal when the smoothed signals fall below said predetermined reference signal;
   an electronic switch having a control input and a controlled output, said control input coupled to an output of said comparator and receiving the control signal thereat, and the presence of said control signal determining an ON/OFF condition of said controlled output; and,
   means for generating an alarm signal, coupled to said electronic switch, dependent upon the presence of one of said ON and OFF condition of said controlled output.

2. An open battery bank detector circuit as claimed in claim 1 wherein said sensor is an iron-core coil rated for continuous operation at about 115 volts alternating current at a frequency of about 60 hertz and producing an output in the range of tens of millivolts, said coil having a longitudinal axis, said coil being disposed adjacent said one cable at a position such that the longitudinal axis is normal to the direction of the alternating current component flowing through said one cable.

3. An open battery bank detector circuit as claimed in claim 2 wherein said means for generating said alarm signal is triggered when said controlled output is in an OFF condition.

4. An open battery bank detector circuit as claimed in claim 3 including a first and second light indicators coupled to said controlled output, said first light indicator being illuminated when said controlled output is in said ON condition, and said second light indicator being illuminated when said controlled output is in said OFF condition.

5. An open battery bank detector circuit as claimed in claim 4 wherein said means for generating said alarm includes a relay switch, said relay switch having a relay control that is coupled to said controlled output such that when said controlled output is in an OFF condition, said relay is activated to trigger said means for generating said alarm.

6. An open battery bank detector circuit as claimed in claim 3 wherein said comparator is an amplifier which has a variable reference signal control.

7. An open battery bank detector circuit as claimed in claim 1 wherein said sensor is a Hall effect device.

* * * * *